(12) United States Patent
Harris et al.

(10) Patent No.: US 9,787,289 B2
(45) Date of Patent: Oct. 10, 2017

(54) M-PATH FILTER WITH OUTER AND INNER CHANNELIZERS FOR PASSBAND BANDWIDTH ADJUSTMENT

(71) Applicant: Xilinx, Inc., San Jose, CA (US)

(72) Inventors: Fredric J. Harris, San Diego, CA (US); Christopher H. Dick, San Jose, CA (US)

(73) Assignee: XILINX, INC., San Jose, CA (US)

( * ) Notice: Subject to any disclaimer, the term of this patent is extended or adjusted under 35 U.S.C. 154(b) by 175 days.

(21) Appl. No.: 14/791,811

(22) Filed: Jul. 6, 2015

(65) Prior Publication Data
US 2017/0012596 A1    Jan. 12, 2017

(51) Int. Cl.
*H03H 7/46*     (2006.01)
*H03H 17/02*    (2006.01)

(52) U.S. Cl.
CPC ............................ *H03H 17/0266* (2013.01)

(58) Field of Classification Search
CPC .................................................. H03H 17/0266
USPC .......................................................... 333/132
See application file for complete search history.

(56) References Cited

U.S. PATENT DOCUMENTS

| 7,372,907 B2* | 5/2008 | Munoz ............... H03H 17/0266 370/210 |
| 9,008,204 B1 | 4/2015 | Dick |
| 9,014,319 B1 | 4/2015 | Copeland |

OTHER PUBLICATIONS

Creany, Stephen et al., "Designing Efficient Digital Up and Down Converters for Narrowband System," XAPP1113 (v1.0), Nov. 21, 2008, pp. 1-76, Xilinx, Inc., San Jose, California, USA.

(Continued)

*Primary Examiner* — Robert Pascal
*Assistant Examiner* — Kimberly Glenn
(74) *Attorney, Agent, or Firm* — W. Eric Webostad

(57) ABSTRACT

Disclosed is apparatus and method to filter a signal. In such an apparatus, an outer polyphase filter is configured for receiving an input signal and for channelizing the input signal into outer filtered samples. An outer Inverse Fourier Transform block is coupled to the outer polyphase filter and configured for transforming the outer filtered samples into a coarse multi-path output. An inner polyphase filter is coupled to a path of the coarse multi-path output for receiving information therefrom and configured for generating inner filtered samples of the information obtained from the path. The inner filtered samples are for moving an edge of a passband associated with the outer filtered samples toward a center of the passband.

20 Claims, 11 Drawing Sheets

(56) References Cited

OTHER PUBLICATIONS

De Leon, Phillip L., "On the Use of Filter Banks for Parallel Digital Signal Processing," Proc. of the 7th NASA Symposium on VLSI Design, Oct. 1998, pp. 1-9.
Gockler, Heinz G., "Polyphase Realisation of Fractional Sample Rate Converters," Proc. of the 1999 European Conference on Circuit Theory & Design, Aug. 29, 1999, pp. 1-4, Levrotto & Bella, Torino, Italy.
Spectrum Signal Processing, "Wideband Networking Waveform OFDM PHY," Oct. 28, 2008, pp. 1-2, Spectrum Signal Processing, Burnaby, British Columbia, Canada.
Harris, Fred et al., "Multi-Resolution PR NMDFBs for Programmable Variable Bandwidth Filter in Wideband Digital Transceivers," Proc. of the 2014 19th Conference on Digital Signal Processing, Aug. 20, 2014, pp. 104-109, IEEE, Piscataway, New Jersey, USA.
Specification and drawings for U.S. Appl. No. 14/662,099, filed Mar. 18, 2015, Dick, Christopher H.
Specification and drawings for U.S. Appl. No. 14/791,852, filed Jul. 6, 2015, Harris et al.

\* cited by examiner

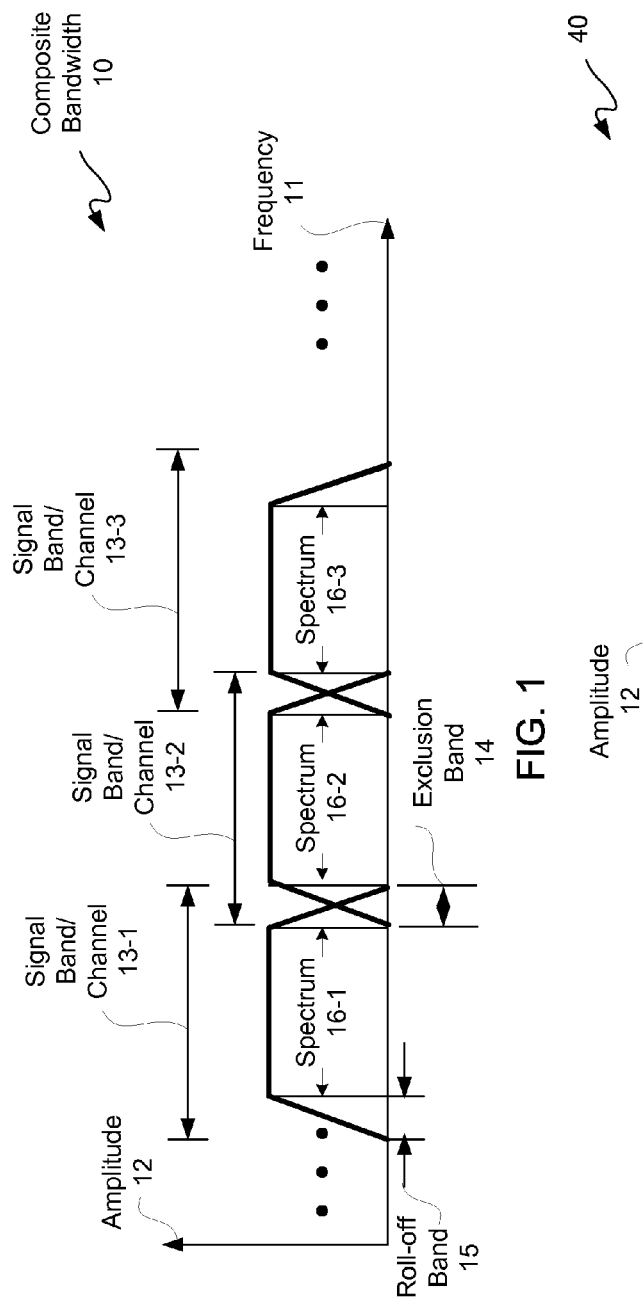
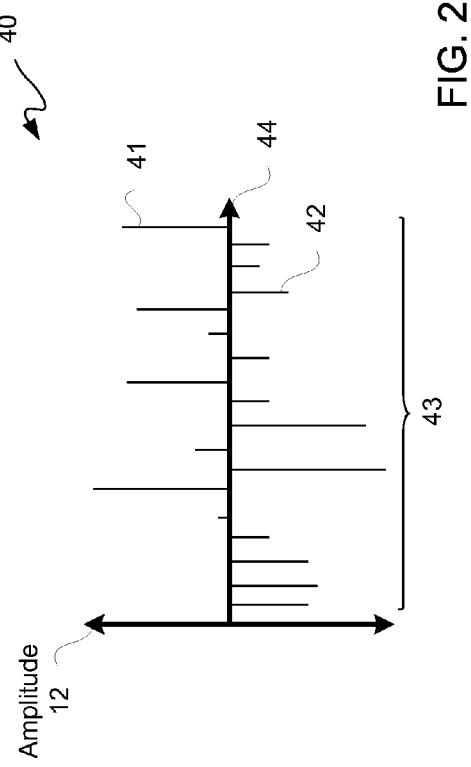

M-PATH FILTER WITH OUTER AND INNER CHANNELIZERS FOR PASSBAND BANDWIDTH ADJUSTMENT

TECHNICAL FIELD

The following description relates to integrated circuit devices ("ICs"). More particularly, the following description relates to an M-path filter with outer and inner channelizers for passband bandwidth adjustment for an IC.

BACKGROUND

Digital up converters ("DUCs") and digital down converters ("DDCs") are well-known circuits used in signal processing. Conventionally, a modulated digital input signal is up-converted prior to being input to a digital-to-analog converter ("DAC") of a DUC, and, conventionally, a modulated analog input signal is input to an analog-to-digital converter ("ADC") of a DDC for subsequent digital down conversion by such a DDC.

An overall bandwidth of a multi-carrier signal is conventionally proportional to a sum of the bandwidths of component carriers of such multi-carrier signal, namely a passband of such component carriers. Moreover, such a passband of component carriers may be larger or smaller than a sampling frequency, fs, divided by the number of component carriers, M. Such a non-native resolution bandwidth fs/M is generally referred to herein "an arbitrary passband bandwidth".

Accordingly, it is desirable and useful to provide an M-path filter for multi-channel or multi-band signals that is adjustable to an arbitrary passband bandwidth of component carriers.

SUMMARY

An apparatus relates generally to signal filtering. In such an apparatus, an outer polyphase filter is configured for receiving an input signal and for channelizing the input signal into outer filtered samples. An outer Inverse Fourier Transform block is coupled to the outer polyphase filter and configured for transforming the outer filtered samples into a coarse multi-path output. An inner polyphase filter is coupled to a path of the coarse multi-path output for receiving information therefrom and configured for generating inner filtered samples of the information obtained from the path. The inner filtered samples are for moving an edge of a passband associated with the outer filtered samples toward a center of the passband.

An apparatus relates generally to signal channelizing. In such an apparatus, an outer analysis channelizer is configured for receiving and channelizing an input signal for generating a coarse multi-path output. An inner analysis channelizer is coupled to the outer analysis channelizer for receiving a first portion of the coarse multi-path output and configured for channelizing the first portion of the coarse multi-path output into a refined multi-path output for moving an edge of a passband associated toward a center of the passband. The passband is associated with the coarse multi-path output. The edge of the passband is associated with the first portion of the coarse multi-path output. A plurality of delays is coupled to the outer analysis channelizer for receiving a second portion of the coarse multi-path output and configured for delaying the second portion of the coarse multi-path output for generating a delayed multi-path output.

A method relates generally to signal filtering. In such a method, an input signal having a plurality of carriers or bands is obtained. The input signal is first channelized with an outer tier of a path filter to generate a coarse multi-path output. A portion of the coarse multi-path output is second channelized with an inner tier of the path filter to generate a refined multi-path output. A remaining portion of the coarse multi-path output is delayed. The refined multi-path output is composed into a path output. The remaining portion of the coarse multi-path output delayed and the path output as a combined multi-path output is output. The second channelizing is for moving an edge of a passband associated with an aggregate of the coarse multi-path output.

Other features will be recognized from consideration of the Detailed Description and Claims, which follow.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

FIG. 1 is a spectral diagram depicting an exemplary conventional composite waveform.

FIG. 2 is a signal diagram depicting an exemplary conventional discrete time domain signal.

FIG. 5-1 is a block diagram depicting an exemplary analysis filter bank outer channelizer.

FIG. 5-2 is a block diagram depicting an exemplary analysis filter bank inner channelizer.

FIG. 6-1 is a block diagram depicting an exemplary synthesis filter bank outer compositor.

FIG. 6-2 is a block diagram depicting an exemplary synthesis filter bank inner compositor.

FIGS. 7-1 through 7-3 are respective signal diagrams depicting an exemplary progression of adjustments to a right edge of a passband of an outer tier channel band adjusted with an inner tier channelizer.

DETAILED DESCRIPTION

Figure 3:
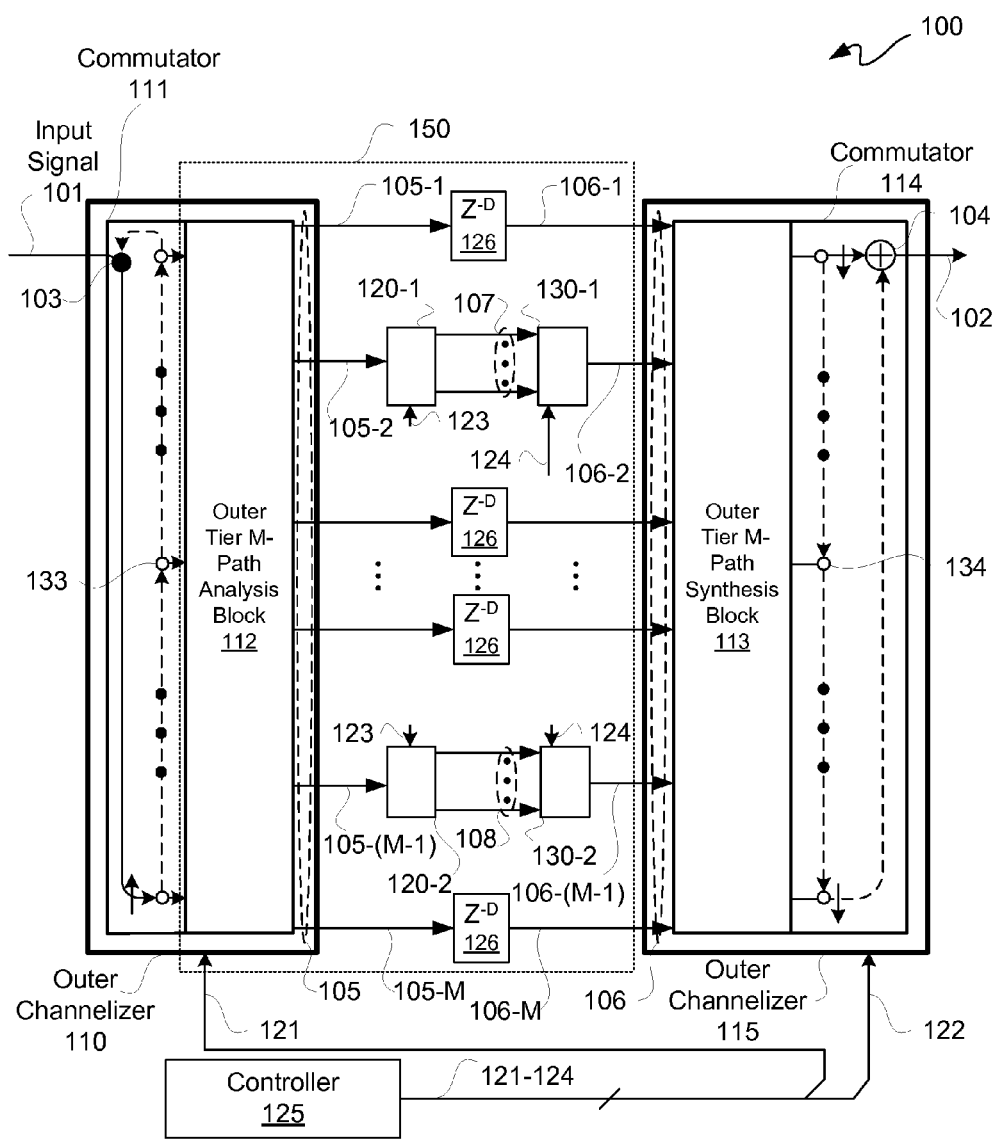
FIG. 3 is a block diagram depicting an exemplary arbitrary passband bandwidth resolution channelizer having nested outer tier and inner tier channelizers.

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Exemplary apparatus(es) and/or method(s) are described herein. The word "exemplary" is used herein to mean "serving as an example, instance, or illustration." Any example or feature described herein as "exemplary" is not necessarily to be construed as preferred or advantageous over other examples or features.

Before describing the examples illustratively depicted in the several figures, a general introduction is provided to further understanding.

A passband bandwidth of an M-path filter is conventionally 1/M-th of an input sample rate. In a polyphase M-path filter, adjacent channel bandwidths (e.g., an integer K) can be merged to synthesize a filter with a bandwidth equal to an integer multiple of 1/M-th of the sample rate, which may mathematically be expressed as K/M multiplied by fs. However, the bandwidth of a design target synthesized filter may not be an integer multiple of fs/M in some instances. In other words, in those instances, the bandwidth of a design target synthesized filter may be a non-integer multiple of fs/M. Along those lines, an M-path filter, such as of a DUC or DDC, may have to support bandwidths which differ from integer multiples of fs/M in some applications.

When K analysis channels of an M-path channelizer are to be combined to synthesize a target composite bandwidth, changes in composite bandwidth can occur by: changing K, where K is the number of channel filter bands that span a design target bandwidth; and/or increasing M to reduce granularity (i.e., providing finer tuning capability) of a channelizer bandwidth fs/M. Generally, increasing M may mean increasing the length of a prototype filter and increasing the number of paths in a polyphase filter, as well as increasing the size of a channelizer IDFT and increasing the transport delay of a synthesis filter. Unfortunately, having a longer filter adds additional overhead complexity. Moreover, bandwidth channelization of a multi-band or multi-carrier signal conventionally was not performed with a polyphase filter in which a channelized bandwidth is different, smaller or larger, than a sampling frequency divided by a number of channels or carriers, M. This meant using costlier processing chains as compared with using a polyphase filter approach.

Conventional M-path polyphase filters provide a computationally efficient means for channelization of a spectrum into M sub-channels with each sub-channel supporting a bandwidth of fs/M, where fs is an input signal sample rate, where M is a positive integer greater than one, and where fs/M is a native passband bandwidth. In other word, so long as each signal of interest has a bandwidth that is commensurate with fs/M, namely for a channelized bandwidth that is equal to a native resolution bandwidth fs/M, then conventional M-path polyphase filters may be used.

However, if a signal of interest did not have a bandwidth that is commensurate or native to fs/M, then such conventional M-path polyphase filters were not used for channelization due to the lack of capability to tune to a channel filter passband bandwidth, namely tune to such an arbitrary passband bandwidth. In the past, polyphase filters did not provide sufficiently fine variation in bandwidths for some applications. Accordingly, due to lack of small increments of granularity or tuning resolution, polyphase filters with fixed bandwidths different than a composite bandwidth, Kfs/M, meant not using such polyphase filters in favor of more traditional architectures having more computational workload and other overhead.

Accordingly, polyphase analysis and synthesis filters with fixed bandwidths larger or smaller than one or more composite signals meant not using such polyphase filters on such composite signals having such arbitrary passband bandwidths. In other words, a conventional polyphase channelizer was not capable of supporting a channelizer having channel bandwidths are arbitrary passband bandwidth, namely not aligned with a native resolution bandwidth, fs/M, of such conventional polyphase channelizer.

As described below in additional detail, M-path tiered polyphase analysis filters and polyphase synthesis filters may be used for channelizing even when not aligned with a native resolution bandwidth, fs/M, of channelized M sub-channels. This capability may be used for an arbitrary passband bandwidth for resolution by a channelizer having composite filters with finer bandwidth resolution. Along those lines, a polyphase filter may have an aggregate passband, and this arbitrary passband bandwidth may be refined on at least one end or edge thereof for tailoring to a bandwidth of an application. This refinement may be provided with another tier of polyphase filtering at edges or near to edges of such passband, rather than throughout such passband. In other words, by adjusting at least one edge of an aggregate passband output of a polyphase filter, an M-path polyphase filter may be used for channelization due to the capability to tune to a channel filter passband.

Such tiered analysis and synthesis filter banks may be used to build channelizers for DUCs and DDCs. Even though a channelizer for a DUC for providing a composite signal from a plurality of baseband signals is described below in additional detail, a reciprocal operation of a DDC for channelizing a received composite signal into a plurality of baseband signals thereof likewise follows from such description. Thus, for example, on a transmitter side, multiple digital carrier signals may be digitally up converted by a DUC to provide a composite signal for input to a DAC for subsequent transmission, and, on a receiver side, after passing through an ADC, such a composite signal may be digitally down converted by a DDC to provide such constituent carrier signals.

This input signal may be channelized for transmitting/uplinking, such as with a DUC, or for receiving/downlinking, such as with a DDC. Moreover, such input signal may be channelized for transmission or reception for a communication medium of a cable network, a hardwired computer network, and/or a wireless network. This channelizing may be for parsing of component signals, such as for example carriers in a multi-carrier signal, subcarriers in a multi-subcarrier signal, or bands in a multi-band signal.

With the above general understanding borne in mind, various configurations for polyphase path filtering are generally described below.

Figures 1, 5:
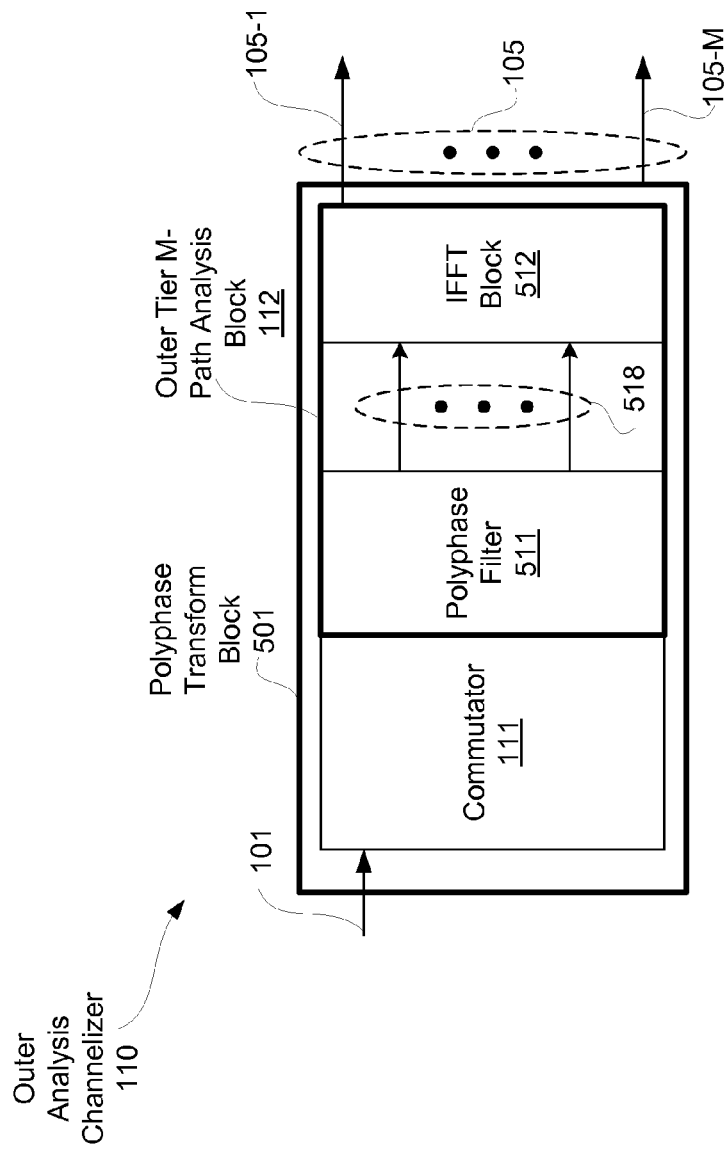

FIG. 1 is a spectral diagram depicting an exemplary conventional composite bandwidth or spectrum ("composite bandwidth") 10. In this example, composite bandwidth 10 includes one frequency-shifted baseband input spectra spanned by channels 13-1 through 13-3 (i.e., channel or channels 13). In this example, channels 13 are serially adjacent to one another in frequency, where transition bands of filters cross generally at their half-amplitude levels. However, in another example, there may be gaps between two or more of channels 13 for example. Channels 13-1 through 13-3 have corresponding usable spectrums 16-1 through 16-3 (i.e., spectrum or spectrums 16). Composite bandwidth 10 may be a multi-band/multi-carrier signal.

This is just one example of a composite waveform, and accordingly other examples of composite waveforms may be used. Generally, for a composite bandwidth 10, there are at least two channels 13 which are at least proximate to one another in frequency. In this example, an envelope of each of such channels 13 is generally the same in both amplitude along a y-axis 12 and frequency along an x-axis 11. However, in another example, envelopes may be different from one another in either or both amplitude and frequency. Furthermore, in this example a roll-off band 15 of each of channels 13 touches or overlaps a roll-off band 15 of a frequency adjacent neighboring channel for providing an exclusion band 14 between usable spectrums. However, in another example, frequency adjacent roll-off bands may be spaced apart from one another in frequency for providing corresponding exclusion bands 14.

Orthogonally Frequency-Division Multiplexing ("OFDM") may be used in digital television, wireless local area networks, and cellular networks, among other applications. In the United States, a cable network compliant with Docsis 3.0 used a single carrier quadrature amplitude modulation ("QAM") that consumed all available spectrum. However, digital video broadcasters in other countries have used OFDM. A next generation of cable networks in the United States may be compliant with Docsis 3.1, which specification adds in using multi-carrier OFDM. Multi-carrier OFDM may have a composite signal 10, and so for purposes of clarity by way of example and not limitation, it shall be assumed that composite signal 10 is for multi-carrier OFDM; however, other forms of modulation may be used.

Rather than a single carrier using all the available spectrum or bandwidth ("W"), as in a single carrier QAM cable network, such spectrum may be divided into M narrow bands ("W/M") or subcarriers ("channels") in a cable network using OFDM. Along those lines, data may be divided into multiple data streams, where each of such data streams may be transmitted and received on a separate band of such N narrow bands. Such data for OFDM may be transformed from a discrete frequency domain to a discrete time domain using an Inverse Discrete Fourier Transform ("IDFT"), which may be implemented as an Inverse Fast Fourier Transform ("IFFT"). Conversely, such data for OFDM may be transformed from a discrete time domain to a discrete frequency domain using a Discrete Fourier Transform ("DFT"), which may be implemented as a Fast Fourier Transform ("FFT").

There may be many channels on a same cable upstream or downstream feed, as channel bandwidth may be substantially smaller than cable bandwidth. Accordingly, for purposes of clarity and not limitation, it shall be assumed that overall bandwidth of channels 13-1 through 13-3 is substantially less than overall cable bandwidth.

Furthermore, cable bandwidth may vary depending on the cable transmission medium used. For example, throughput or bandwidth of a cable transmission medium may vary depending on whether it is fiber optic or copper wire, as well as the size of such cabling. Furthermore, any intermediate nodes coupling cable transmission mediums, as well as usage rates, may affect throughput. Additionally, different channels may have different resolutions and/or frame rates, and thus channels may have different bandwidth demands. For example, a high-definition television ("HDTV") channel may use more bandwidth than a standard-definition television ("SDTV"), and enhanced-definition television ("EDTV") may use an amount of bandwidth between HDTV and SDTV usages.

Accordingly, providing flexibility in terms of channel filtering for transmission and/or reception via a cable medium may be useful for cable broadcasters in various markets. However, the following description is not limited to cable mediums, but may be used in other forms of wired transmission and/or reception and/or may be used in wireless transmission and/or reception. Again, the example of cable transmission and reception is for purposes of clarity and not limitation.

Each of channels 13-1 through 13-3 may be a cavity or discrete spectral space in which discrete time domain signals of an N-point IDFT are present. Each of channels 13-1 through 13-3, which have spaced center frequencies, may be used to transmit a respective discrete time domain signal.

Figures 2, 5:
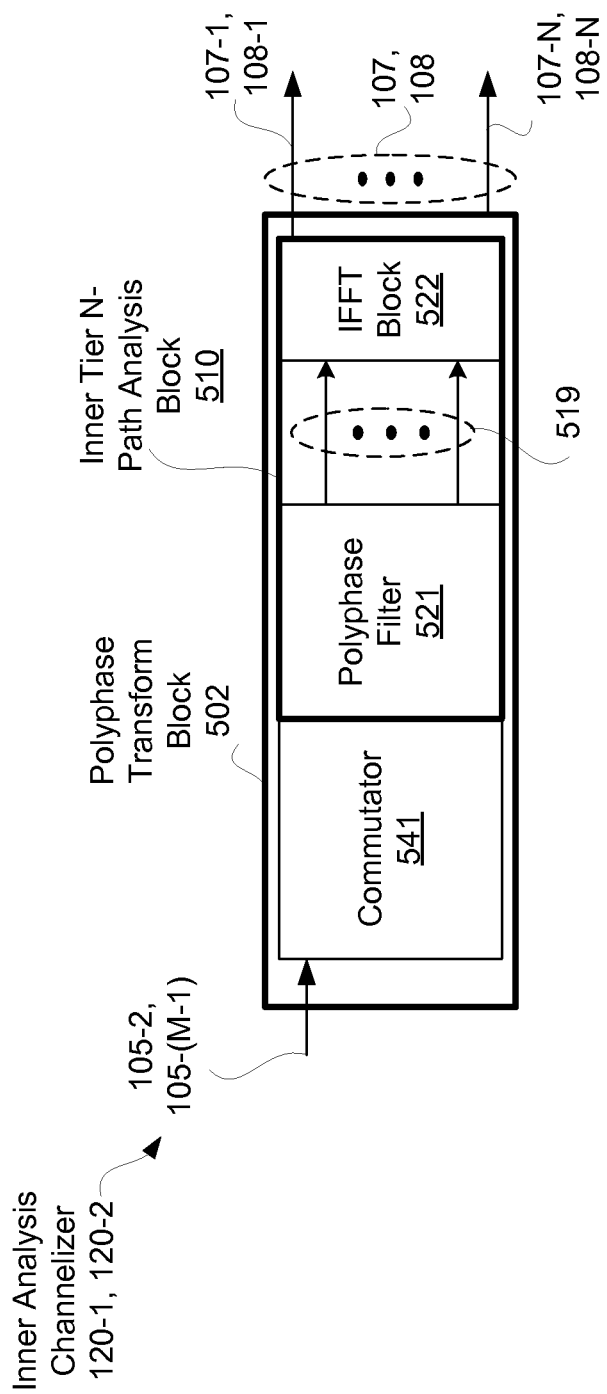

For purposes of clarity by way of example and not limitation, FIG. 2 is a signal diagram depicting an exemplary conventional discrete time domain signal 40. Discrete time domain signal 40 is depicted along a time x-axis 44 and an amplitude y-axis 12. Discrete time domain signal 40 includes IDFT samples 43. For purposes of clarity and not limitation, it shall be assumed that an IDFT is provided with an IFFT to provide IFFT output samples 43.

IFFT output samples 43 may be obtained by inputting parallel data streams, such as from audio-visual ("AV") inputs for example, into an IFFT block. Even though AV inputs are described below as a form of data inputs for purposes of clarity by way of example, any type of data input may be used. However, for this example, it shall be assumed that data may be packetized, including without limitation Internet Protocol packets.

Each of IFFT output samples 43 may be a sum of signal samples of such AV inputs. Such summation of signal samples may result in a positive amplitude IFFT output sample 41 of IFFT output samples 43, or such summation of signal samples may result in a negative amplitude IFFT output sample 42 of IFFT output samples 43. Such an IFFT block may perform modulation and multiplexing in a single operation for output of IFFT output samples 43. The number of samples or points of an IFFT block may be a set number. Outputs of IFFT blocks of modulators of a cable headend may be brought out for coupling to RF ports, which may correspond to cable transmission mediums. Along those lines, multiple composite signals may be delivered to one RF port using high-speed DACs.

A conventional sample rate for such high-speed DACs is 4.9152 GHz. Even though this sample rate is described herein for purposes of clarity by way of example, any of a variety of sample rates may be used. Continuing such example, it shall be assumed that channel bandwidth of channels 13 is 192 MHz for each of such channels, where each usable spectrum bandwidth is 190 MHz and rolloff bandwidth on either side of such usable spectrum is 1 MHz in accordance with Docsis 3.1. Thus, each OFDM signal or channel 13 may have useful information bearing a span of 190 MHz. These or other bandwidths may be used.

Thus, for this example of three channels 13, there are three 192 MHz wide baseband OFDM signals to be prepared for input as a composite signal to a DAC for sampling at 4.9152 GHZ. Even though the following description is for up-conversion using a DUC, down-conversion using a DDC may likewise be used as follows from the description hereinbelow.

By replacement of a conventional path filter with path filter as described hereinbelow, a conventional digital up-conversion path may be converted to digital up-conversion path having less overhead, which may be used for Docsis 3.1 or another digital up conversion application. In other words, by being able to tune a polyphase filter to a target channel filter passband, a channelizer may be provided, such as for a DUC or DDC, having efficiencies associated with polyphase filtering without having to resort to application specific filters.

FIG. 3 is a block diagram depicting an exemplary arbitrary passband bandwidth resolution channelizer ("channelizer") 100 having outer tier channelizers and nested inner tier channelizers. Channelizer 100 may be used for filtering and up converting or up sampling an input signal 101. Channelizer 100 may be implemented in a DUC for digital up conversion.

Input signal 101 may include a plurality of baseband signals and/or a plurality of carrier signals. Generally, input signal 101 may be thought of as a multi-carrier/multi-band signal. Constituent components, such as channels or bands ("passbands"), of input signal 101 may be respectively commutated by commutator 111 of an outer analysis channelizer 110 for polyphase filtering. Outer analysis channelizer 110 may be for receiving and channelizing input signal 101 for providing a multi-path output 105. Multi-path output 105 may include a plurality of discrete filtered samples of input signal 101, namely a coarse multi-path output. This plurality of discrete filtered samples of input signal 101 may be thought of as coarse frequency bins or components of an aggregate passband. As described below in additional detail, at least one of these frequency components may be refined to tailor a cutoff frequency. For purposes of clarity by way of example and not limitation, cutoff frequencies are refined at both ends of an aggregate passband of a polyphase filter, which conventionally is a bank of filters for different frequency passbands which in the aggregate provide an overall passband.

Commutator 111 provides constituent bands or channels ("passbands") of input signal 101 one at a time to outer tier M-path analysis block 112, which may be implemented with a polyphase filter and an IFFT, as described below in additional detail. Commutator 111 couples input node 103 respectively to input ports 133. Outer tier M-path analysis block 112 may polyphase filter and transform such filtered samples to provide an M-path output, namely an M-point output.

Along those lines, for purposes of clarity by way of example and not limitation, it shall be assumed that a passband of an input signal 101 is sampled to provide 128 samples, namely 128 paths of multi-path output 105 from path 105-1 to path 105-M, where M is equal to 128 in this example. In other examples, M may be a positive integer less than or greater than 128. In this example, an upper 64 paths of M-path output are for positive frequencies, and a lower 64 paths of M-path output are for negative frequencies of a passband, namely negative and positive with reference to a center frequency of such passband.

In this implementation, optionally an uppermost path 105-1 may be used as a guard band path, and optionally a lowermost path 105-M may be used as a guard band path. Even though only one path is used for providing a guard band for upper and lower frequency protection, in another implementation more than one path may be used. Furthermore, in another implementation a guard band may be biased to one frequency side or another.

In this example, a next to uppermost path 105-2 and a next to lowermost path 105-(M-1) are used for adjusting corner frequencies, namely edges, of a sampled passband. An inner analysis channelizer 120-1 may be coupled to path 105-2 for receiving and channelizing a positive frequency portion of multi-path output 105 for providing a positive corner frequency or edge portion of a multi-path output 106. An inner analysis channelizer 120-2 may be coupled to path 105-(M-1) for receiving and channelizing a negative frequency portion of multi-path output 105 for providing a negative corner frequency or edge portion of a multi-path output 106. Inner analysis channelizers 120 may be coupled to outputs of multi-path output 105 corresponding to spectra associated with cut-off frequencies at ends of a passband of an aggregate of such multi-path output 105.

Delays 126 having a delay corresponding to a total delay of inner analysis channelizer 120 and inner synthesis channelizer 130 pairs may be respectively coupled to other paths of multi-path output 105 not coupled to an inner analysis channelizer 120. Delays 126 receiving and delaying a portion of multi-path output 105 not coupled to an inner analysis channelizer 120 may provide delayed versions of "points" on such paths to an outer tier M-path synthesis channelizer 113 of outer synthesis channelizer 115 for providing a portion of multi-path output 106. Accordingly, a delay 126 receiving information via path 105-1 provides a delayed version of such information via path 106-1, and a delay 126 receiving information via path 105-M provides a delayed version of such information via path 106-M.

Inner analysis channelizers 120-1 and 120-2 may respectively be smaller versions of outer analysis channelizer 110. Likewise inner synthesis channelizers 130-1 and 130-2 corresponding to inner analysis channelizers 120-1 and 120-2 may be smaller versions of outer synthesis channelizer 115. A synthesis channelizer may be thought of as having a complementary operation with respect to an analysis channelizer, namely an inverse channelizer. Generally, a synthesis channelizer receives "points" representing a passband, or a portion thereof, and merges such points into a composite signal.

Inner analysis channelizer 120-1 receives information from path 105-2, namely a point associated with a positive corner frequency contribution, and provides an N-path refined multi-path output 107, namely multiple "points" for such "point", as outputs for input to inner synthesis channelizer 130-1. In this example, multi-path output 107 is a 10 path or point output. However, in other implementations, N may be a positive integer less than or greater than 10. Generally, M is at least a multiple of 10 greater than N, but M may have other values. For example, M can be 1 when an inner filter is implemented not with an M-path filter but with a 1-path non-polyphase form of filter.

Inner analysis channelizer 120-2 receives information from path 105-(M-1), namely a point associated with a negative corner frequency contribution, and provides an N-path refined multi-path output 108, namely multiple points for such point, as outputs for input to inner synthesis channelizer 130-2. Likewise, in this example, multi-path output 108 is a 10 path or point output. However, in other implementations, the number of paths may be another positive integer greater than one.

Multipath output 107 may be processed by inner synthesis channelizer 130-1 to provide a single path output 106-2. Multipath output 108 may be processed by inner synthesis channelizer 130-2 to provide a single path output 106-(M-1). Path output 106-2 and/or path output 106-(M-1) may be refined versions of frequency components corresponding to information on path outputs 106-2 and 106-(M-1), respectively.

Information on outputs 106-2 and 106-(M-1) may correspond to adjustments of information on outputs 105-2 and 105-(M-1), respectively. These tuning adjustments may be for moving positive and negative corner frequencies or edges of a passband inwardly toward the center of such passband to reduce bandwidth of such passband. Though both edges of a passband may be moved inwardly as described herein, in another implementation only one edge of a passband, positive or negative, may be moved. In such an implementation, a single pair of an inner analysis channelizer 120 and an inner synthesis channelizer 130 may be used.

As described herein, refinement of a passband is only for reducing a passband of a path filter. However, if a greater refinement of an edge of a passband was to be implemented, a path of N-path output 107 and/or 108 may be coupled for input to a further inner analysis channelizer of another inner analysis channel izer-inner synthesis channelizer pair along with a set of delays. In other words for example, a path of N-path multi-path output 107 may have thereon another inner analysis-synthesis channelizer pair, namely located between inner analysis channelizer 120-1 and inner synthesis channelizer 130-1, with remaining paths of such N-path multi-path output 107 having corresponding delays. Outer tier M-path analysis block 112, which may be a polyphase transform, as well as one or more inner analysis channelizers 120, may generally be thought of as a "path filter" 150.

M-path output 106 is provided as an input to outer tier M-path synthesis channelizer 113. Outputs of M-path synthesis channelizer 113 may be respectively commutated by commutator 114 to an output adder 104 for combination into a passband of a composite output signal 102. Output ports 134 may be respectively coupled to output adder 104 to provide a composite output signal 102. Output signal 102 may be coupled for input to a DAC.

A controller 125 may be coupled for providing control signals 121 through 124 respectively to outer analysis channelizer 110, outer synthesis channelizer 115, inner analysis channelizers 120-1 and 120-2, and inner synthesis channelizers 130-1 and 130-2. Control signals 121 through 124 may generally be start and stop signals for sequencing of data.

Figure 4:
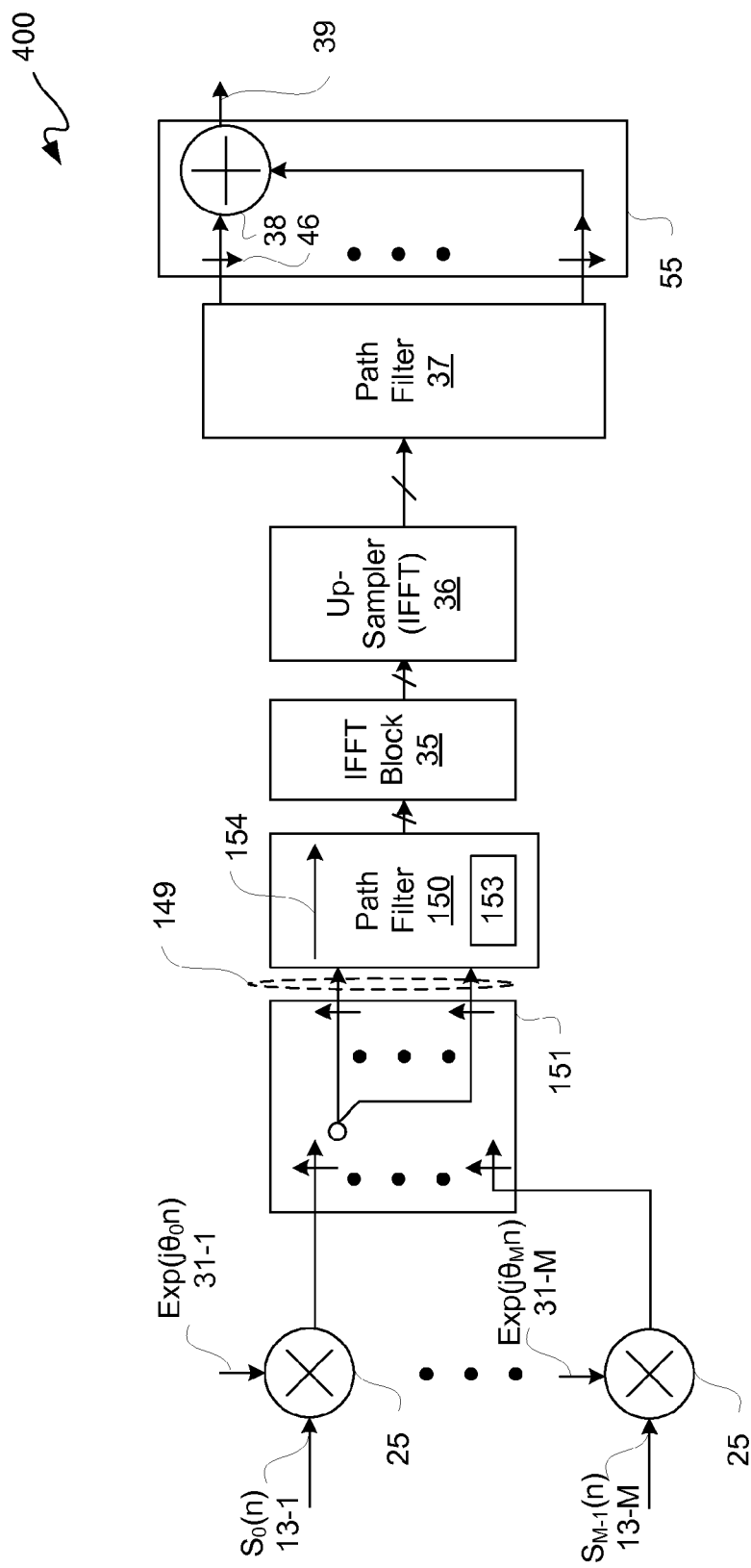
FIG. 4 is a block diagram depicting an exemplary digital up-conversion path.

To better understand how polyphase filters may be used as path filters for a multi-channel wideband DUC for Docsis 3.1, FIG. 4 is a block diagram depicting an exemplary digital up-conversion path 400. Baseband input signals $S_0(n)$ 13-1 through $S_{M-1}(n)$ 13-M may be respectively input to corresponding multipliers 25. For purposes of clarity by way of example and not limitation, it shall be assumed that each of baseband input signals 13 has a channel bandwidth of 192 MHz, a sample rate of 204.8 MHz for M equal to 24.

Exponents or coefficients $Exp(j\theta_0 n)$ 31-1 through $Exp(j\theta_{M-1}n)$ 31-M are respectively input to multipliers 25 for multiplication with baseband input signals $S_0(n)$ 13-1 through $S_{M-1}(n)$ 13-M, respectively, to produce corresponding sets of input samples shifted from one another to provide a composite input signal 149.

These input samples, which in this example are broken out as two sets of 60 input samples each for positive and negative sets, may be commutated, by a commutator 151, as a composite input signal 149 for input to a path filter 150. Such a composite input signal 149 may be commutated, as generally indicated by arrow 154, for a 120 sample input into a path filter 150. Path filter 150 may be an instance of path filter 150 of FIG. 3.

Path filter 150 may include a bank of filters 153, such as in a polyphase filter for example. Length or number of taps of path filter 150 may depend upon the application. Path filter 150 may filter an input signal, such as composite input signal 149 for example, to provide an output to a corresponding IFFT block 35. In this example, path filter 150 output is 120 filtered samples, which a corresponding IFFT block 35 converts to a 120 point output in this example. IFFT block 35 may perform inverse transform operation, which in this example there are 300 operations to provide a 120 point output, which output may be input to an up sampler 36.

Output of up sampler 36 is provided as an input to path filter 37. Up sampler 36 for this example may likewise be an N equal to 2880 point IFFT block, namely 24 multiplied by 120 for 1 to 24 upsampling. Again, in this example, up sampler 36 may perform 24000 operations for each 2880 point output, or approximately 8.3 operations per sample (i.e., approximately 8 taps), and such 2880 point output may be provided to a 2880 path filter 37. Each filtered output of path filter 37 may be commutated by commutator 55 as generally indicated by arrows 46 to adder 38 for combination to provide a passband in the aggregate of a composite output signal 39.

Generally, composite signal 39 may be a composition of frequency translated and frequency multiplied baseband input signals 13-1 through 13-M. In this example, each output of path filter 37 is 1440 filtered output samples, where two sets of 1440 filtered output samples each corresponding to positive and negative spectrums of a channel output are commuted to adder 38 for forming a composite output signal 39 by adder 38. Composite output signal 39 may thus have up sampled and frequency translated positive and negative component bands of baseband input signals 13 distributed about a center sampling frequency.

Digital up-conversion path 400, as well as the above-described values, is just one example implementation. Other implementations, as well as these or other values, may be used in other implementations. However, by replacement of a conventional path filter with path filter 150 as described herein, a conventional digital up-conversion path may be converted to digital up-conversion path 400, which may be used for Docsis 3.1 or another DUC application.

While the above description has been use of a polyphase filter for upsampling for channelization, having a tunable polyphase filter may be useful in other applications associated with finite impulse response filtering, including without limitation decimating and interpolating. By providing a tunable polyphase filter, a "polyphase transform" having a more refined bandwidth resolution than a conventional "polyphase transform" may be provided for a DUC, among other applications.

FIG. 5-1 is a block diagram depicting an exemplary analysis filter bank outer channelizer ("outer analysis channelizer") 110. Outer analysis channelizer 110 may be implemented as a polyphase transform block 501 having an outer tier M-path analysis block 112 and an outer commutator 111, as previously described. Outer tier M-path analysis block 112 may include an outer M-path polyphase filter ("polyphase filter") 511 and an outer Inverse Fourier Transform block, such as an IFFT block, 512. IFFT block 512 may be coupled for receiving filtered samples 518 of input signal 101 from polyphase filter 511 for providing multi-path output 105.

FIG. 5-2 is a block diagram depicting an exemplary analysis filter bank, namely inner analysis channelizer 120-1 or 120-2. Such an inner analysis channelizer 120 may be implemented as a polyphase transform block 502 having an inner tier N-path analysis block 510 and an inner commutator 541. Inner tier N-path analysis block 510 may include an inner polyphase filter 521 and an inner Inverse Fourier Transform block, such as an IFFT block 522.

Commutator 541 may be coupled for receiving information via path 105-2 or 105-(M-1) for commutating to a polyphase filter 521. A portion of a frequency spectrum may be commutated to respective filters of a polyphase filter 521. Filtered samples 519 output from such a polyphase filter 521 may be provided as input to an IFFT block 522 for providing multi-path output 107 or 108. Multi-path outputs 107 and 108 may respectively provide path outputs 107-1 through 107-N and 108-1 and 108-N to corresponding inner synthesis channelizers 130-1 and 103-2.

Accordingly, in this implementation, an inner analysis channelizer 120 is a scaled down version of an outer analysis channelizer 110, but with some differences other than the number of output paths. Both outer and inner channelizers commutate an input signal. Outer analysis channelizer 110 commutates a digital input signal in a time domain, where such digital input signal represents a passband, and an inner analysis channelizer 120 commutates a digital input signal in a time domain from base banded and down sampled narrow band channels formed by an input analysis channelizer, where such digital input signal represents the time series from a fraction of such a passband, namely a frequency range associated with a corner frequency and/or edge frequency of such passband.

Additionally, as M is substantially greater than N, an outer analysis channelizer 110 has many more path outputs than an inner analysis channelizer 120. However, by further channelizing a fraction of a passband, such fraction may be a more precise or refined adaptation to a corner and/or edge frequency of an input signal 101. In other words, effectively an inner analysis channelizer 120 may be used to adjust an output band edge of an outer analysis channelizer 110 to more closely align to a targeted corner and/or edge frequency of an input signal 101.

Figures 1, 6:
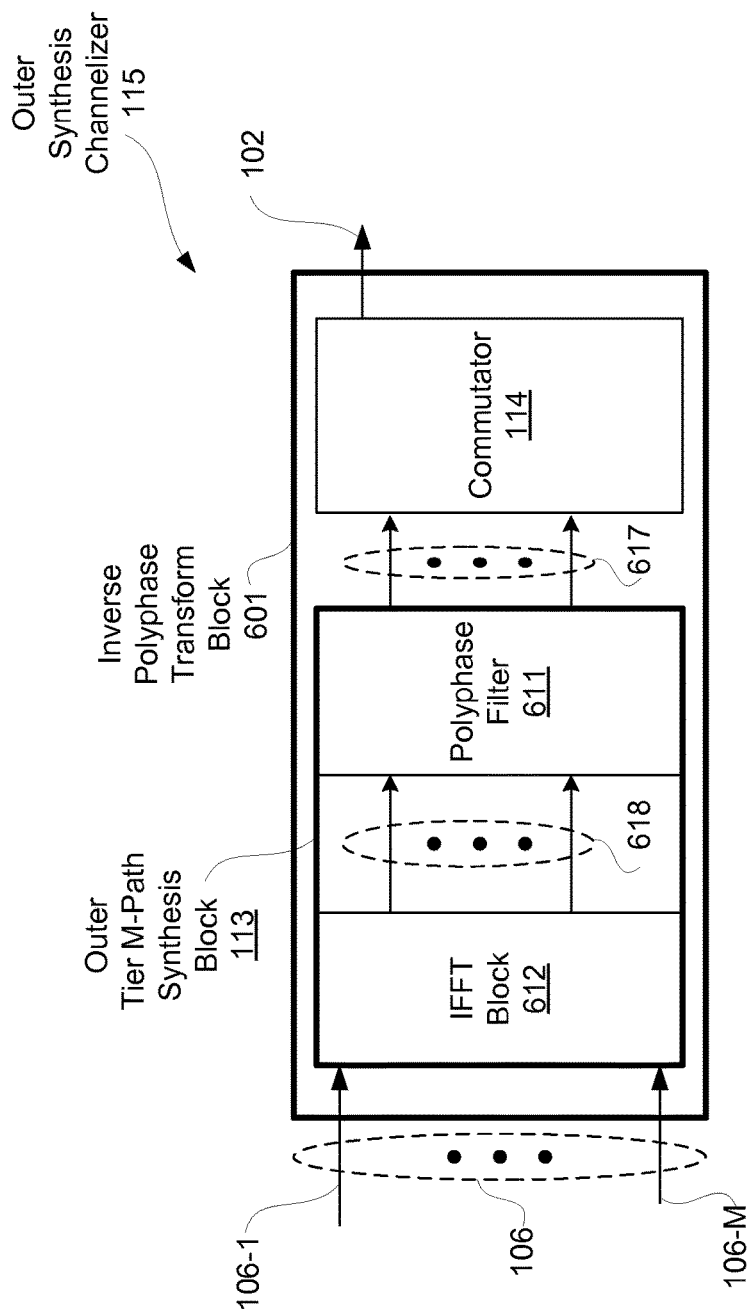
Figures 2, 6:
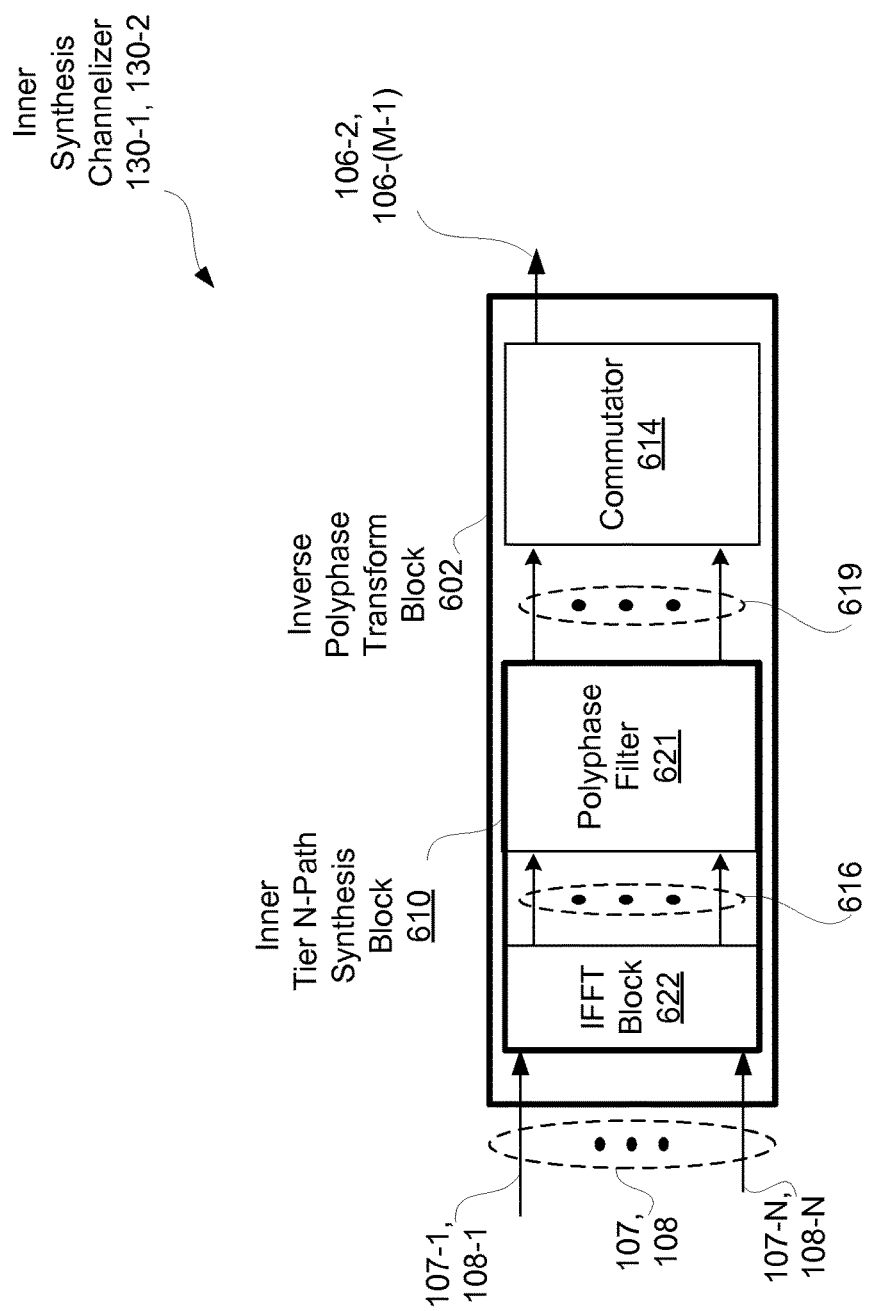

FIG. 6-1 is a block diagram depicting an exemplary synthesis filter bank, namely outer synthesis channelizer 115. Outer synthesis channelizer 115 may be implemented as an inverse polyphase transform block 601 having an outer tier M-path analysis synthesis channelizer 113 and an outer commutator 114, as previously described. Outer tier M-path synthesis channelizer 113 may include an outer Inverse Fourier Transform block, such as an IFFT block, 612 and an outer polyphase filter 611. IFFT block 612 may be coupled for receiving multi-path output 106 for providing up-sampled points or indices 618 to polyphase filter 611. Polyphase filter 611 may filter such indices 618 to provide filtered samples 617 for commutation to an output adder to provide a passband of a composite output signal 102.

FIG. 6-2 is a block diagram depicting an exemplary synthesis filter bank, namely an inner synthesis channelizer 130-1 or 130-2. Such an inner synthesis channelizer may be implemented as an inverse polyphase transform block 602 having an inner tier N-path synthesis block 610 and an inner commutator 614. Inner tier N-path synthesis block 610 may include an inner polyphase filter 621 and an inner Inverse Fourier Transform block, such as an IFFT block 622.

An IFFT block 622 of inner synthesis channelizer 130-1 or 130-2 may be coupled for receiving information via multi-path output 107 or 108, respectively. Multi-path outputs 107 or 108 may be up sampled by such corresponding IFFT block 622 for transforming from a narrow bandwidth time series to a wide bandwidth time domain for providing points or indices 616 to polyphase filter 621. Polyphase filter 621 may provide refined filtered samples 619 from a multi-point output of IFFT block 622 for providing to commutator 614. Commutator 614 may be coupled for receiving filtered samples 619 for commutating for providing inner multi-path output 106-2 or 106-(M-1) respectively for inner synthesis channelizer 130-1 or 130-2.

Accordingly, in this implementation, an inner synthesis channelizer 130 is a scaled down version of an outer synthesis channelizer 115, where M is substantially greater than N, so an outer synthesis channel izer 115 receives many more path outputs than an inner synthesis channelizer 130. However, an inner synthesis channelizer may have a more refined or accurate input with respect to a corner and/or edge frequency component of a passband, as previously described.

Again, as previously described, an implementation for a DUC is described. For a DDC implementation, a reverse direction of operation is used. Along those lines, output of an ADC may be provided for down-sampling to a baseband for channelizing carriers or bands of an ADC output.

Figures 1, 7:
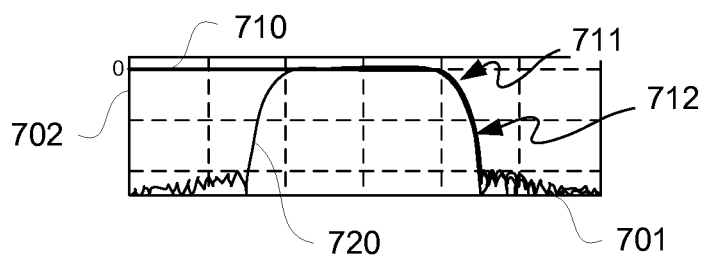
Figures 2, 7:
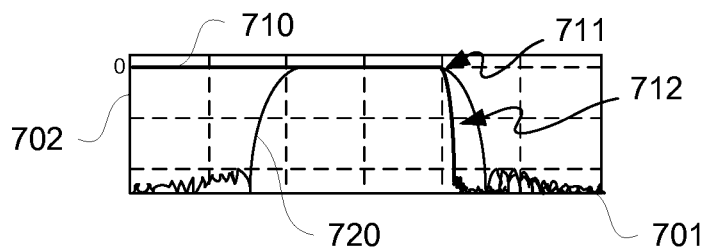
Figures 3, 7:
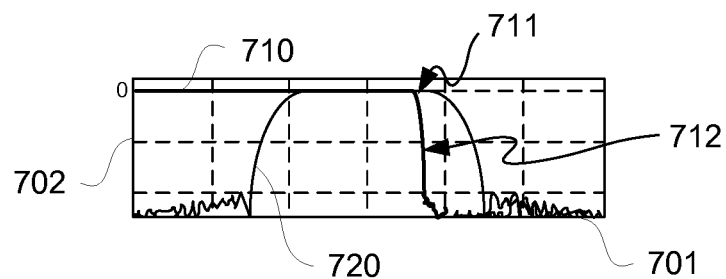

FIGS. 7-1 through 7-3 are respective signal diagrams depicting an exemplary progression of adjustments to a right edge of a passband bandwidth ("filter spectrum") 710 of an outer tier channel band adjusted with an inner tier channelizer. A left or opposing edge 712 of passband filter spectrum 710 is not illustratively depicted for purposes of clarity and not limitation. However, either or both edges 712 may be at or proximate to opposing ends of a passband filter spectrum 710, and either or both of edges 712 may be adjusted. Passband filter spectrum 710 may be thought of as an aggregate response or output of a polyphase filter of an analysis block of an outer analysis channelizer 110, such as previously described.

A filter output of an end filter of a polyphase filter of an analysis block of an outer analysis channelizer 110, such as previously described, is illustratively depicted as a passband filter spectrum 720, which may generally be thought of as static for purposes of this example. Each of the signal diagrams is a plot of frequency along an x-axis 701 versus a log of the magnitude in decibels along a y-axis 702.

With reference to FIG. 7-1, prior to any adjustment, a corner frequency 711 and an edge 712 on a right side of each of passband filter spectrums 710 and 720 are aligned with one another. However, in some applications, it may be useful to pull in, namely toward a center of passband filter spectrum 710, a corner frequency 711 and an edge 712. For example, if a passband filter spectrum 710 has a wider bandwidth than an application in which outer analysis channelizer 110 is used.

If an outer analysis channel izer 110 is an outer channelizer, such as a first tier of channelization for example, then as previously described, an inner or second tier of channelization may be performed by an inner analysis channelizer 120. However, such second tier channelization is not for the aggregate output of such first channelization, rather such second tier channelization is at or near to an end of such aggregate response to pull in such corner frequency 711 and edge 712 of such aggregate passband filter spectrum 710.

With reference to FIGS. 7-2 and 7-3, examples of second tier channelization with an inner analysis channelizer 120 are illustratively depicted. By refining channelization with a second tier channelization, a rolloff of passband filter spectrum 710, namely corner frequency 711 and edge 712, may be pulled in to more closely correspond to actual bandwidth of an input signal, rather than a fixed bandwidth of a channelizer. In other words, in the past, conventional path filters came in discrete bandwidths. However, some applications did not use bandwidths exactly aligned to such discrete bandwidths, meaning that more bandwidth was used than necessary.

By being able to adjust bandwidth of passband filter spectrum 710, a path filter may be tailored to bandwidth of an application. For a Docsis 3.1 application for example, it may be useful to be able to use a polyphase filter bank for reasons of efficiency; however, without being able to tailor path filter bandwidth to such application, use of a polyphase filter may be precluded for above-indicated reasons. However, by providing ability to adjust bandwidth as described herein, a polyphase filter may be used for such a Docsis 3.1 application or other applications in which a polyphase filter was previously precluded.

By only adjusting bandwidth at one or more ends of a passband output of a polyphase filter, sufficient refinement may be provided without for example refining other components of such passband output. Accordingly, added overhead is constrained to adjustment of bandwidth. This means generally that a "wide" bandwidth polyphase filter may be used in many applications in which a "narrow" bandwidth filter was used. In other words, by modulating a cut-off frequency of a polyphase filter, such polyphase filter may be used in more applications. One such application is a channelizer, as a channelizer may have to be able to meet a bandwidth specification, as may vary from application-to-application.

Because one or more of the examples described herein may be implemented in an FPGA, a detailed description of such an IC is provided. However, other types of ICs may benefit from the technology described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 8:
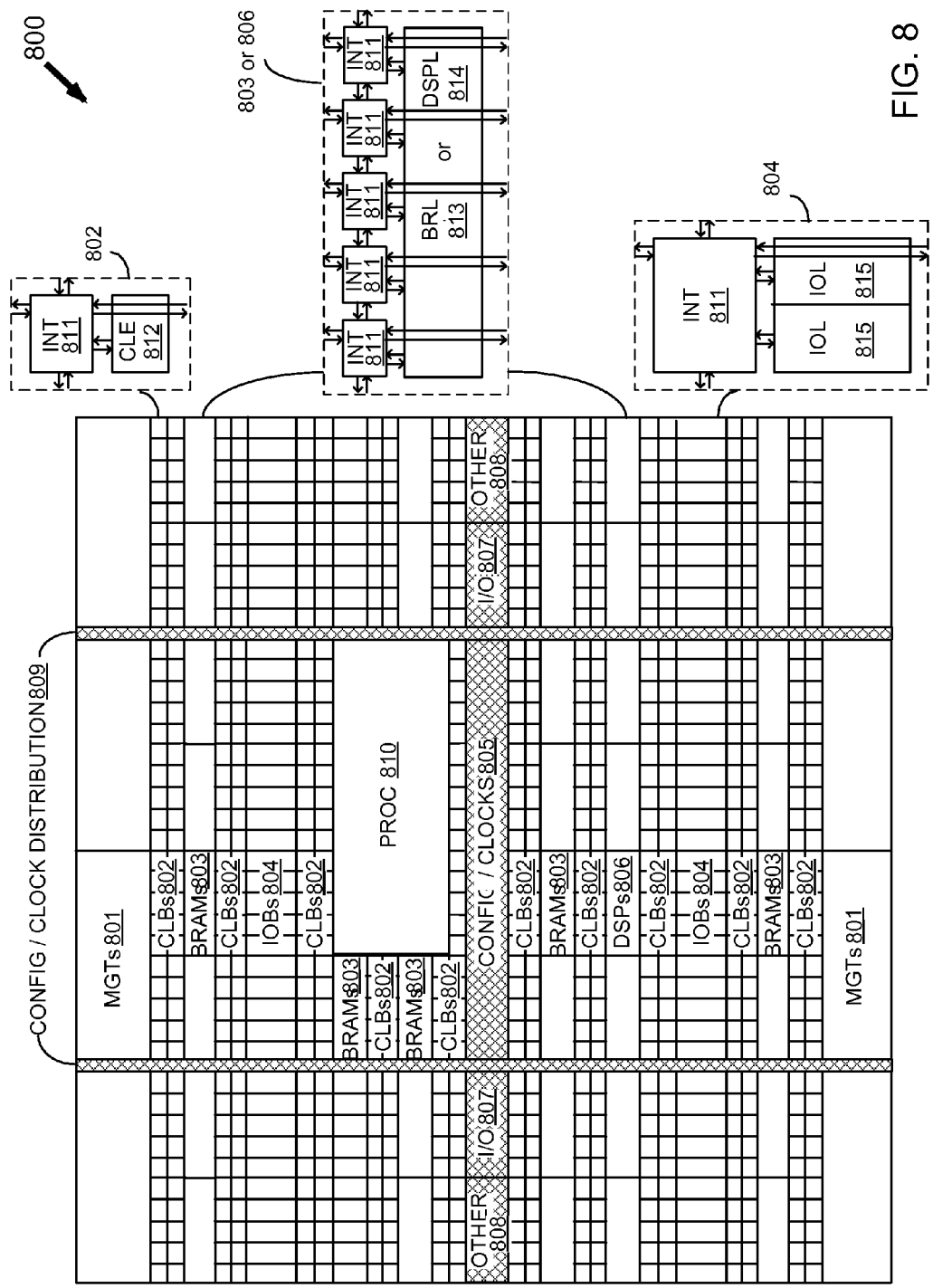
FIG. 8 is a simplified block diagram depicting an exemplary columnar Field Programmable Gate Array ("FPGA") architecture.

As noted above, advanced FPGAs can include several different types of programmable logic blocks in the array. For example, FIG. 8 illustrates an FPGA architecture 800 that includes a large number of different programmable tiles including multi-gigabit transceivers ("MGTs") 801, configurable logic blocks ("CLBs") 802, random access memory blocks ("BRAMs") 803, input/output blocks ("IOBs") 804, configuration and clocking logic ("CONFIG/CLOCKS") 805, digital signal processing blocks ("DSPs") 806, specialized input/output blocks ("I/O") 807 (e.g., configuration ports and clock ports), and other programmable logic 808 such as digital clock managers, analog-to-digital converters, system monitoring logic, and so forth. Some FPGAs also include dedicated processor blocks ("PROC") 810.

In some FPGAs, each programmable tile includes a programmable interconnect element ("INT") 811 having standardized connections to and from a corresponding interconnect element in each adjacent tile. Therefore, the programmable interconnect elements taken together implement the programmable interconnect structure for the illustrated FPGA. The programmable interconnect element 811 also includes the connections to and from the programmable logic element within the same tile, as shown by the examples included at the top of FIG. 8.

For example, a CLB 802 can include a configurable logic element ("CLE") 812 that can be programmed to implement user logic plus a single programmable interconnect element ("INT") 811. A BRAM 803 can include a BRAM logic element ("BRL") 813 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 806 can include a DSP logic element ("DSPL") 814 in addition to an appropriate number of programmable interconnect elements. An 10B 804 can include, for example, two instances of an input/output logic element ("IOL") 815 in addition to one instance of the programmable interconnect element 811. As will be clear to those of skill in the art, the actual I/O pads connected, for example, to the I/O logic element 815 typically are not confined to the area of the input/output logic element 815.

In the pictured embodiment, a horizontal area near the center of the die (shown in FIG. 8) is used for configuration, clock, and other control logic. Vertical columns 809 extending from this horizontal area or column are used to distribute the clocks and configuration signals across the breadth of the FPGA.

Some FPGAs utilizing the architecture illustrated in FIG. 8 include additional logic blocks that disrupt the regular columnar structure making up a large part of the FPGA. The additional logic blocks can be programmable blocks and/or dedicated logic. For example, processor block 810 spans several columns of CLBs and BRAMs.

Note that FIG. 8 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 8 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 9:
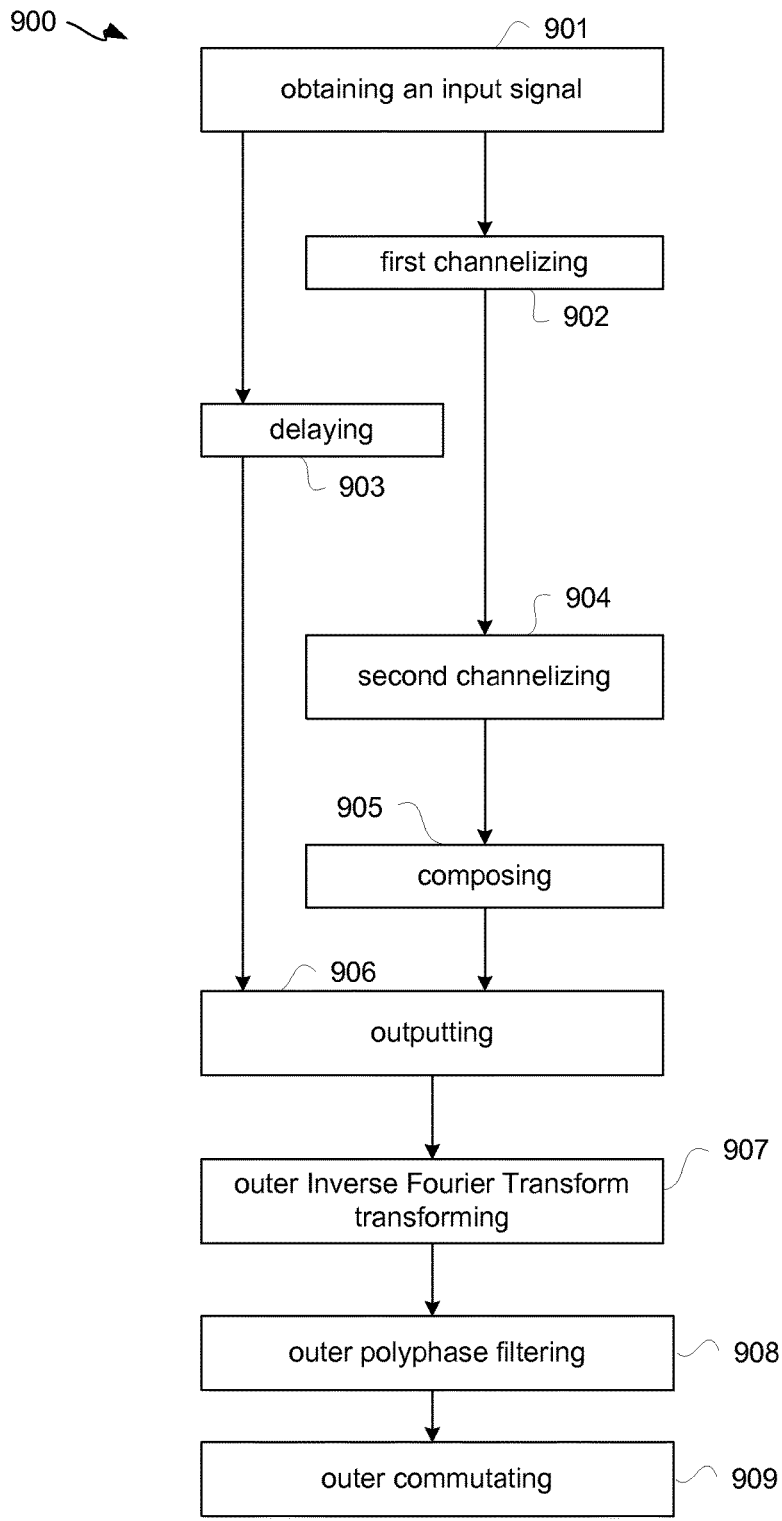
FIG. 9 is a flow diagram depicting an exemplary signal processing flow.

FIG. 9 is a flow diagram depicting an exemplary signal processing flow 900. As signal processing flow 900 is in accordance with an above described path filter with outer and inner polyphase transforms for passband bandwidth adjustment, signal processing flow 900 is further described with simultaneous reference to FIGS. 3 through 9. Along those lines, signal processing flow 900 may be implemented in hardware with dedicated resources and/or field programmable hardware resources.

At 901, an input signal 101 having a plurality of carriers or bands may be obtained, such as by a transmitter. At 902, input signal 101 may be transformed into a channelized input by an outer tier of a path filter 150 to generate a coarse multi-path output 105.

At 904, a portion, such as either or both output path 105-2 or 105-(M-1) for example, of coarse multi-path output 105 may be transformed into a channelized input by an inner tier of path filter 150 to generate a refined multi-path output 107 and/or 108. Channelizing at 904 may be for moving an edge of a passband associated with an aggregate of coarse multi-path output 105. At 905, refined multi-path output 107 and/or 108 may be composed into a path output 106-2 or 106-(M-1), respectively. Again, this inner tier channelizing is for moving either or both edges of a passband associated with an aggregate of a coarse multi-path output 105 to transform.

During operations 902, 904, and 905, a remaining portion, namely remaining output paths 105-1, 105-3 through 105-(M-2), and 105-M of coarse multi-path output 105 may be delayed at 903 to provide delayed versions or output paths106-1, 106-3 through 106-(M-2), and 106-M for alignment with output paths 106-2 and/or 106-(M-1) for alignment of a combined multi-path output 106. At 906, such a remaining portion of coarse multi-path output 105 delayed and path output 106-2 and/or 106-(M-1) may be output as such a combined multi-path output 106.

At 907, such combined multi-path output 106 may be outer Inverse Fourier Transform transformed into a plurality of indices 618. At 908, such plurality of indices 618 may be outer polyphase filtered with a polyphase filter 611 for providing filtered samples 617. At 909, such filtered samples 617 may be outer commutated for providing an output signal 102.

Figure 10:
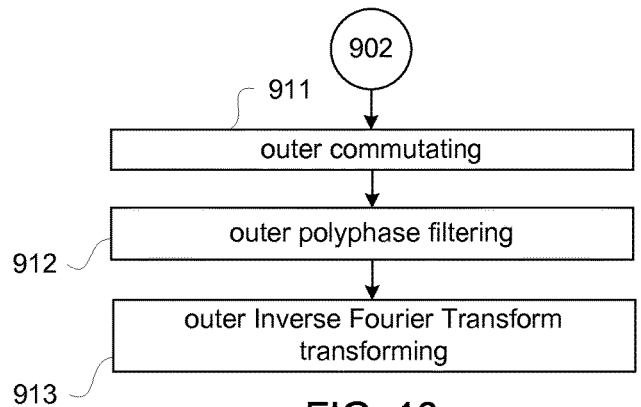
FIGS. 10 through 12 are respective flow diagrams depicting exemplary signal processing sub-operations of respective operations of the signal processing flow of FIG. 9.

With reference to FIG. 10, such first channelizing at 902 may include operations at 911 through 913. At 911, input signal 101 may be outer commutated to a polyphase filter 511. At 912, outer polyphase filtering of input signal 101 may be performed for providing filtered samples 518 of input signal 101. At 913, outer Inverse Fourier Transform transforming of filtered samples 518 may be performed for conversion of such samples in a time domain into a reduced sample rate narrowband time domain series to provide coarse multi-path output 105.

Figure 11:
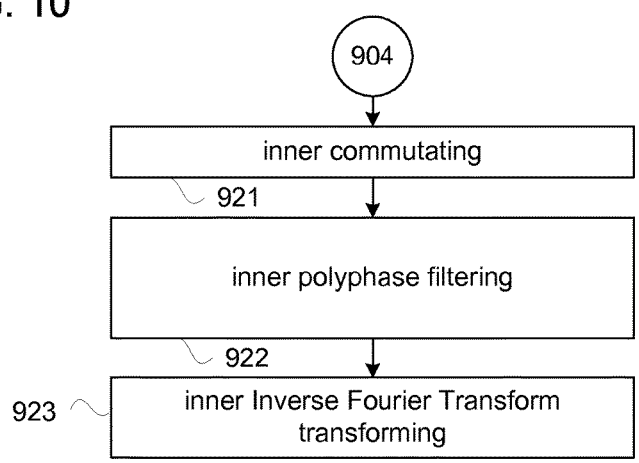

With reference to FIG. 11, such second channelizing at 904 may include operations at 921 through 923. At 921, a portion 105-2 and/or 105-(M-1) of information of coarse multi-path output 105 may be inner commutated to a polyphase filter 521 of a corresponding inner analysis channelizer 120. At 922, inner polyphase filtering of such portion or portions of coarse multi-path output 105 may be performed for providing filtered samples 519 corresponding thereto. At 923, inner Inverse Fourier Transform transforming may be performed on such corresponding filtered samples 519 for conversion from a coarse resolution frequency domain into a fine resolution frequency domain for providing a refined multi-path output, namely either or both multi-path output 107 or108.

Figure 12:
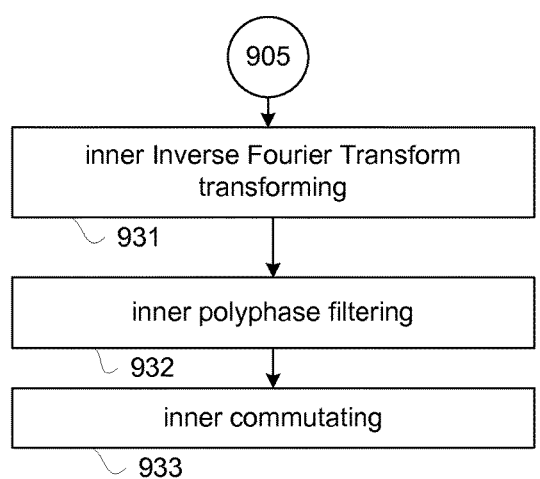

With reference to FIG. 12, composing of a second multi-path output 107 or 108 into a corresponding path output 106-2 and/or 106-(M-1) may include operations 931 through 933. At 931, inner Inverse Fourier Transform transforming of either or both a refined multi-path output 107 or 108 in a fine resolution frequency domain into a corresponding plurality of samples 616 in a time domain may be performed. At 932, inner polyphase filtering such plurality of samples 616 with a polyphase filter 621 of a corresponding inner compositor 130 may be performed for generating filtered samples 619. At 933, inner commutating such filtered samples 619 may be performed for generating a corresponding path output, namely path output 106-2 and/or 106-(M-1).

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. An apparatus for signal filtering, comprising:
an outer polyphase filter configured for receiving an input signal and for channelizing the input signal into outer filtered samples;
an outer Inverse Fourier Transform block coupled to the outer polyphase filter and configured for transforming the outer filtered samples into a coarse multi-path output;
an inner polyphase filter coupled to a path of the coarse multi-path output for receiving information therefrom and configured for generating inner filtered samples of the information obtained from the path; and
wherein the inner filtered samples are for moving an edge of a passband associated with an aggregate of the outer filtered samples toward a center of the passband.

2. The apparatus according to claim 1, further comprising an inner Inverse Fourier Transform block coupled to the inner polyphase filter and configured for transforming the inner filtered samples into a refined multi-path output.

3. The apparatus according to claim 2, wherein the inner Inverse Fourier Transform block is a first inner Inverse Fourier Transform block, the apparatus further comprising a second inner Inverse Fourier Transform block coupled to the first inner Inverse Fourier Transform block and configured for transforming the refined multi-path output into a plurality of indices.

4. The apparatus according to claim 3, wherein the inner polyphase filter is a first inner polyphase filter, the apparatus further comprising a second inner polyphase filter coupled to the second inner Inverse Fourier Transform block and configured for transforming the plurality of indices for generating refined filtered samples.

5. The apparatus according to claim 4, further comprising an outer commutator configured for receiving the input signal as a composite signal having a plurality of passbands and for commutating each of the passbands to the outer polyphase filter.

6. The apparatus according to claim 5, further comprising an inner commutator coupled to the path of the coarse multi-path output and configured for commutating the information to the first inner polyphase filter.

7. An apparatus for signal channelizing, comprising:
an outer analysis channelizer configured for receiving and channelizing an input signal for generating a coarse multi-path output;
an inner analysis channelizer coupled to the outer analysis channelizer for receiving a first portion of the coarse multi-path output and configured for channelizing the first portion of the coarse multi-path output into a refined multi-path output for moving an edge of a passband associated toward a center of the passband;
the passband being associated with the coarse multi-path output;
the edge of the passband being associated with the first portion of the coarse multi-path output; and
a plurality of delays coupled to the outer analysis channelizer for receiving a second portion of the coarse multi-path output and configured for delaying the second portion of the coarse multi-path output for generating a delayed multi-path output.

8. The apparatus according to claim 7, further comprising an inner synthesis channelizer coupled to the inner analysis channelizer and configured for composing the refined multi-path output into a single path output.

9. The apparatus according to claim 8, wherein the inner synthesis channelizer comprises:
an inner synthesis block coupled to the inner analysis channelizer and configured for transforming and filtering the refined multi-path output into a plurality of filtered samples; and
an inner commutator coupled to the inner synthesis block and configured for commutating the plurality of filtered samples for generating the single path output.

10. The apparatus according to claim 9, wherein the inner synthesis block includes an Inverse Fourier Transform block and a polyphase filter coupled to one another.

11. The apparatus according to claim 8, further comprising an outer synthesis channelizer coupled to the plurality of delays and the inner synthesis channelizer and configured for composing the delayed multi-path output and the single path output into an output signal.

12. The apparatus according to claim 11, wherein the outer synthesis channelizer comprises:
an outer synthesis block coupled to the plurality of delays and the inner synthesis channelizer for receiving the delayed multi-path output and the single path output and configured for generating a plurality of filtered samples; and
an outer commutator coupled to the outer synthesis block and configured for commutating the plurality of filtered samples for generating the output signal.

13. The apparatus according to claim 12, wherein the outer synthesis block includes an Inverse Fourier Transform block and a polyphase filter coupled to one another.

14. The apparatus according to claim 7, wherein the outer analysis channelizer comprises:
an outer commutator configured for receiving and commutating the input signal; and
an outer analysis block coupled to the outer commutator and configured for filtering and transforming the commutated input signal for generating the coarse multi-path output.

15. The apparatus according to claim 14, wherein the inner analysis channelizer comprises:
an inner commutator coupled to the outer analysis channelizer and configured to commutate the first portion of the coarse multi-path output; and
an inner analysis block coupled to the inner commutator and configured for filtering and transforming the first portion of the coarse multi-path output commutated for generating the refined multi-path output.

16. The apparatus according to claim 15, wherein:
the outer analysis block includes a first polyphase filter and a first Inverse Fourier Transform block coupled to one another; and
the inner analysis block includes a second polyphase filter and a second Inverse Fourier Transform block coupled to one another.

17. A method for signal filtering, comprising:
obtaining an input signal having a plurality of carriers or bands;
first channelizing the input signal with an outer tier of a path filter to generate a coarse multi-path output;
second channelizing a portion of the coarse multi-path output with an inner tier of the path filter to generate a refined multi-path output;
delaying a remaining portion of the coarse multi-path output;
composing the refined multi-path output into a path output;
outputting the remaining portion of the coarse multi-path output delayed and the path output as a combined multi-path output; and
wherein the second channelizing is for moving an edge of a passband associated with an aggregate of the coarse multi-path output.

18. The method according to claim 17, wherein the first channelizing comprises:
outer commutating the input signal to a polyphase filter;
outer polyphase filtering the input signal for providing filtered samples of the input signal; and
outer Inverse Fourier Transform transforming the filtered samples into the coarse multi-path output.

19. The method according to claim 17, wherein the second channelizing comprises:
inner commutating the portion of the coarse multi-path output to a polyphase filter;
inner polyphase filtering the portion of the coarse multi-path output commutated for providing filtered samples; and
inner Inverse Fourier Transform transforming the filtered samples into the refined multi-path output.

20. The method according to claim 17, wherein the composing of the refined multi-path output into the path output comprises:
inner Inverse Fourier Transform transforming the refined multi-path output into a plurality of samples;
inner polyphase filtering the plurality of samples with a polyphase filter for generating filtered samples; and
inner commutating the filtered samples for generating the path output.

* * * * *